(12) United States Patent
Lee

(10) Patent No.: US 7,186,644 B2
(45) Date of Patent: Mar. 6, 2007

(54) METHODS FOR PREVENTING COPPER OXIDATION IN A DUAL DAMASCENE PROCESS

(75) Inventor: Date Gun Lee, Icheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 11/026,984

(22) Filed: Dec. 30, 2004

(65) Prior Publication Data

US 2005/0142854 A1 Jun. 30, 2005

(30) Foreign Application Priority Data

Dec. 31, 2003 (KR) ............ 10-2003-0102069

(51) Int. Cl.
*H01L 21/4763* (2006.01)
*H01L 21/44* (2006.01)
(52) U.S. Cl. ............ 438/637; 438/687; 438/700
(58) Field of Classification Search ............ 438/637, 438/634, 687, 700
See application file for complete search history.

(56) References Cited

U.S. PATENT DOCUMENTS

| 6,303,498 | B1 | 10/2001 | Chen et al. ............ 438/675 |
| 6,323,121 | B1 | 11/2001 | Liu et al. |
| 6,355,571 | B1 * | 3/2002 | Huang et al. ............ 438/706 |
| 6,372,636 | B1 * | 4/2002 | Chooi et al. ............ 438/639 |
| 6,607,975 | B1 | 8/2003 | Agarwal ............ 438/622 |
| 6,703,309 | B1 | 3/2004 | Chopra ............ 438/659 |
| 2001/0051420 | A1 * | 12/2001 | Besser et al. ............ 438/597 |

\* cited by examiner

*Primary Examiner*—Hsien-Ming Lee
(74) *Attorney, Agent, or Firm*—Saliwanchik, Lloyd & Saliwanchik

(57) ABSTRACT

Methods of preventing oxidation of a copper interconnect of a semiconductor device are disclosed. An example method forms a lower copper interconnect on a substrate having at least one predetermined structure, deposits a nitride layer on the lower copper interconnect and on the substrate, and sequentially depositing a first insulating layer, an etch-stop layer, and a second insulating layer on the nitride layer. The example method also forms a trench and a via hole through the second insulating layer and the first insulating layer by using a dual damascene process, etches the nitride layer so as to expose some portion of the lower copper interconnect, and supplies combining gas onto the exposed portion of the lower copper interconnect.

7 Claims, 1 Drawing Sheet

METHODS FOR PREVENTING COPPER OXIDATION IN A DUAL DAMASCENE PROCESS

RELATED APPLICATION

This application claims the benefit of Korean Application No. 10-2003-0102069, filed on Dec. 31, 2003, which is hereby incorporated herein by reference in its entirety.

TECHNICAL FIELD

The present disclosure relates to semiconductor devices and, more particularly, methods for preventing the oxidation of a copper interconnect in a dual damascene process.

BACKGROUND

As semiconductor devices have become more highly integrated, the width of metal interconnects of semiconductor devices has also been reduced. Such reduction in the width of the interconnects may cause electro migration (EM) due to an increase in an electrical current density, thereby deteriorating the reliability of the metal interconnect. To obviate such problem, instead of aluminum, copper has been suggested as a new interconnect material for semiconductor devices. Copper has a lower specific resistance than the aluminum and ensures high interconnect reliability. However, copper cannot form a fine interconnect pattern by using a dry etching process because copper compounds have low volatility.

To solve the problem patterning with copper, a damascene process has been developed. The damascene process forms a copper interconnect of a semiconductor device by depositing an interlayer dielectric (ILD) layer on a semiconductor device, forming a trench through the ILD layer by using a photolithography process, filling the trench with copper, and performing a chemical mechanical polish (CMP) process for the copper trench. Particularly, a dual damascene process, which is broadly used for forming multi-layer metal interconnects, forms a via and a metal interconnect at the same time by using only one CMP process.

A known dual damascene process deposits a first insulating layer on a substrate having at least one predetermined structure. An etch-stop layer and a second insulating layer are sequentially deposited on the first insulating layer. A first photoresist pattern for a via hole is formed on the second insulating layer by using a photolithography process. The second insulating layer, the etch-stop layer, and the first insulating layer are dry-etched by using the first photoresist pattern as a mask. The first photoresist pattern is then removed to complete a via hole through the first insulating layer. A second photoresist pattern for a trench is formed on the resulting structure by using a photolithography process. The second insulating layer is dry-etched by using the second photoresist pattern as a mask. The second photoresist is removed to complete a trench for a metal interconnect through the second insulating layer. The via hole and the trench are filled with copper and planarized by a planarization process to form a via and a copper interconnect.

However, the copper interconnect formed by the above-described known method may be oxidized while it is exposed to the air because a dangling bond in the surface of the copper interconnect reacts with oxygen in the air. To prevent the oxidation of the copper interconnect, a barrier metal layer and a copper seed layer should sequentially be deposited on the copper interconnect within nine hours after the copper interconnect is exposed to the air.

DETAILED DESCRIPTION

Figure 1:
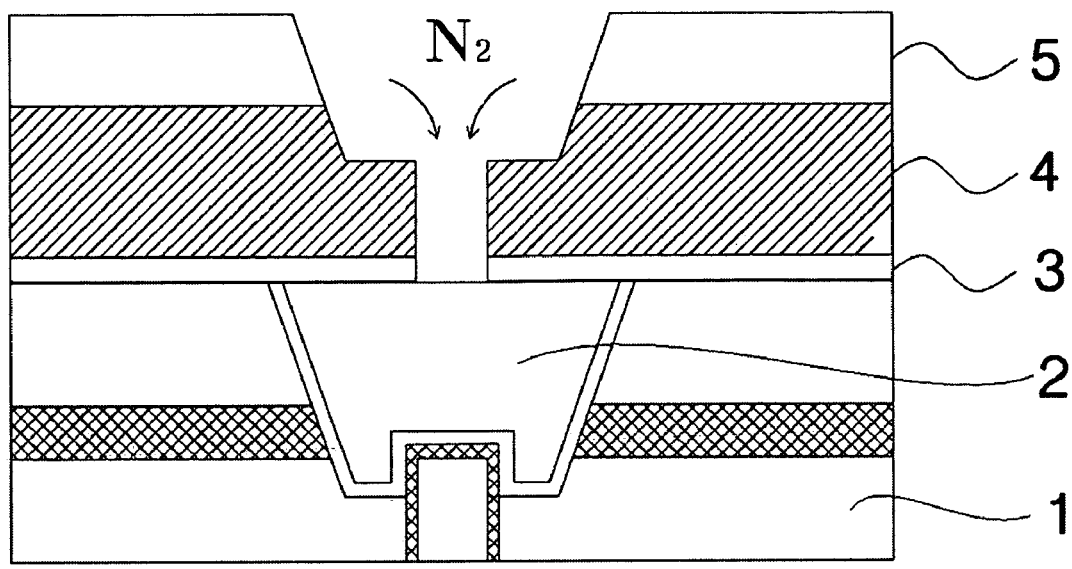
FIG. 1 and FIG. 2 are cross-sectional views illustrating an example process of fabricating a copper interconnect of a semiconductor device.

Referring to FIG. 1, a via hole and a trench are formed in a substrate 1 having at least one predetermined structure. The via hole and the trench are filled with copper and planarized to form a lower copper interconnect 2. A nitride layer 3 is deposited on the lower copper interconnect 2 and on the substrate 1. A first insulating layer 4, an etch-stop layer (not shown), and a second insulating layer 5 are sequentially deposited on the nitride layer 3. Some portion of the second insulating layer 5, the etch-stop layer, and the first insulating layer 4 is removed by using an etching process. As a result, a via hole is formed through the first insulating layer 4. Next, the second insulating layer 5 is etched by using a predetermined mask to form a trench. The trench for an interconnect and the via hole are completed.

Here, some portion of the nitride layer 3 is removed during the etching process for forming the via hole so that some portion of the top surface of the lower copper interconnect 2 is exposed. Exposed copper generally has dangling bonds, which tend to easily combine with other molecules. Therefore, if the lower copper interconnect 2 is exposed in the air, the surface of the lower copper interconnect 2 reacts with oxygen in the air to be oxidized. Such oxidized copper deteriorates electrical characteristics of the copper interconnect.

In the illustrated example process, to prevent the surface of the lower copper interconnect 2 from reacting with oxygen in the air, combining gas is supplied onto the exposed lower copper interconnect 2. The combining gas combines with the copper of the exposed lower copper interconnect 2. The combining gas is preferably supplied before the lower copper interconnect 2 is exposed to the air. The combining gas is preferably nitrogen gas or hydrogen gas. The illustrated example method for preventing copper oxidation using combining gas may be performed under conditions of, for example, time 20 sec/gap 30 mm/$N_2$ 240 sccm (standard cubic centimeter per minute)/upper power 700 W/bottom power 70 W/bottom temperature 20° C./cooling He edge 25 T/center 15 T within an error range of about 10% although the conditions may differ according to the apparatus used.

Figure 2:
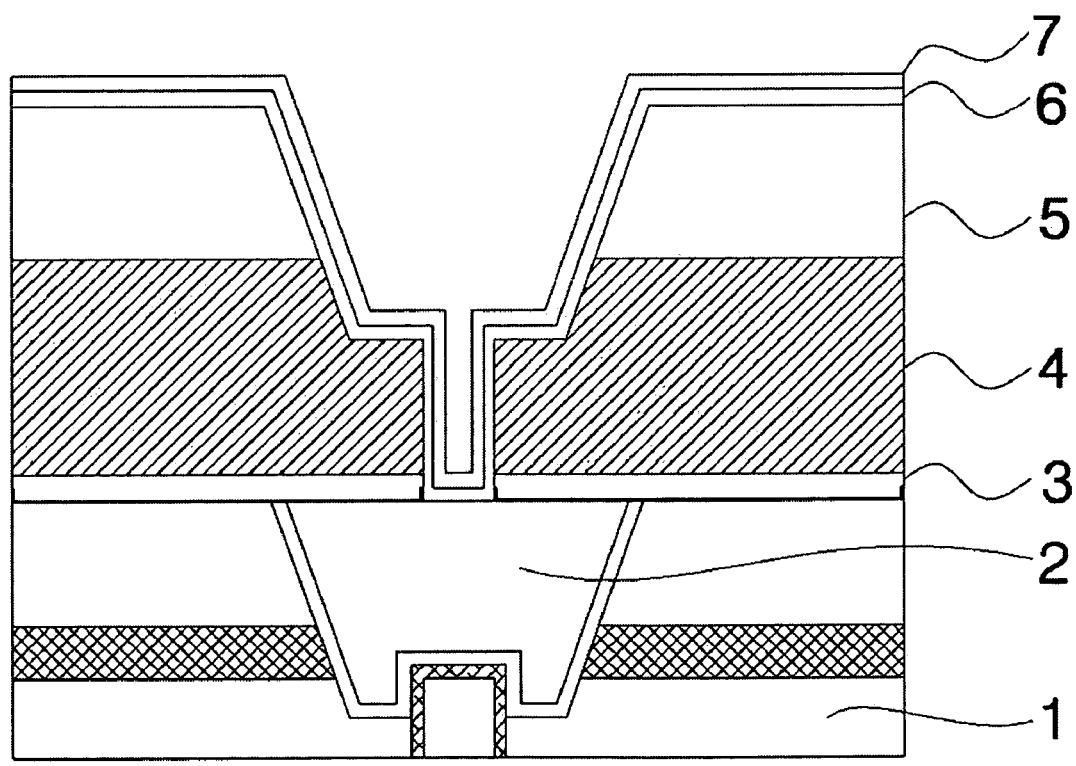

Referring to FIG. 2, a barrier metal layer 6 is deposited on the structure of FIG. 1. A copper seed layer 7 is then formed on the barrier metal layer 6. Here, the nitrogen combined with the surface of the lower copper interconnect 2 is removed while a sputtering process is performed to deposit the barrier metal layer 6.

In the illustrated example process, the period between the etching of the nitride layer 3 and the deposition of the barrier metal 6 is of no importance anymore. As described above, the conventional process has to perform a barrier metal deposition process within nine hours after the nitride layer on the lower copper interconnect is removed, but, by supplying combining gas onto the exposed lower copper interconnect 2, the illustrated example process can perform a later unit process without considering the period of nine hours.

From the foregoing, persons of ordinary skill in the art will appreciate that, by supplying combining gas onto an exposed portion of a copper interconnect, the disclosed methods of fabricating a copper interconnect of a semiconductor device can prevent the exposed surface of the copper interconnect from reacting with oxygen in the air, thereby solving the problem that a later unit process has to be performed within a predetermined time before the exposed copper interconnect is oxidized.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method for preventing oxidation of a copper interconnect of a semiconductor device, comprising:

forming a lower copper interconnect on a substrate having at least one predetermined structure;

depositing a nitride layer on the lower copper interconnect and on the substrate;

sequentially depositing a first insulating layer, an etch stop layer, and a second insulating layer on the nitride layer;

forming a trench and a via hole through the second insulating layer and the first insulating layer by using a dual damascene process;

etching the nitride layer so as to expose some portion of the lower copper interconnect; and supplying combining gas onto the exposed portion of the lower copper interconnect, wherein the combining gas combines with the copper of the exposed portion of the lower copper interconnect, wherein supplying the combining gas is carried out under conditions of time 20 sec/gap 30 mm/$N_2$ 240 sccm/upper power 700 W/bottom power 70 W bottom temperature 20° C./cooling He edge 25 T/center 15 T at an error range of about 10%.

2. The method as defined by claim 1, wherein the combining gas is nitrogen gas or hydrogen gas.

3. The method as defined by claim 2, further comprising:

depositing a barrier metal layer on the first insulating layer, the second insulating layer, and the exposed portion of the lower copper interconnect;

forming a seed metal on the barrier metal layer; and forming a via plug and upper copper interconnect on the seed metal.

4. The method as defined by claim 1, further comprising:

depositing a barrier metal layer on the first insulating layer, the second insulating layer, and the exposed portion of the lower copper interconnect;

forming a seed metal on the barrier metal layer; and forming a via plug and upper copper interconnect on the seed metal.

5. The method as defined by claim 1, further comprising:

depositing a barrier metal layer on the first insulating layer, the second insulating layer, and the exposed portion of the lower copper interconnect;

forming a seed metal on the barrier metal layer; and forming a via plug and upper copper interconnect on the seed metal.

6. A method for preventing oxidation of a copper interconnect of a semiconductor device, comprising:

forming a lower copper interconnect on a substrate having at least one predetermined structure;

depositing a nitride layer on the lower copper interconnect and on the substrate;

sequentially depositing a first insulating layer, an etch stop layer, and a second insulating layer on the nitride layer;

forming a trench and a via hole through the second insulating layer and the first insulating layer by using a dual damascene process;

etching the nitride layer so as to expose some portion of the lower copper interconnect; and supplying combining gas onto the exposed portion of the lower copper interconnect, wherein the combining gas combines with the copper of the exposed portion of the lower copper interconnect, wherein supplying the combining gas onto the exposed portion of the lower copper interconnect comprises having the combining gas present before some portion of the lower copper interconnect is exposed.

7. The method as defined by claim 6, further comprising:

depositing a barrier metal layer on the first insulating layer, the second insulating layer, and the exposed portion of the lower copper interconnect;

forming a seed metal on the barrier metal layer; and forming a via plug and upper copper interconnect on the seed metal.

* * * * *